US010199517B2

(12) United States Patent
Hashigami et al.

(10) Patent No.: US 10,199,517 B2
(45) Date of Patent: Feb. 5, 2019

(54) METHOD FOR PRODUCING HIGH-EFFICIENCY SOLAR CELL

(71) Applicant: SHIN-ETSU CHEMICAL CO., LTD., Tokyo (JP)

(72) Inventors: Hiroshi Hashigami, Annaka (JP); Toyohiro Ueguri, Annaka (JP); Takenori Watabe, Annaka (JP); Hiroyuki Ohtsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/740,160

(22) PCT Filed: Nov. 7, 2016

(86) PCT No.: PCT/JP2016/004822
§ 371 (c)(1),
(2) Date: Dec. 27, 2017

(87) PCT Pub. No.: WO2018/083721
PCT Pub. Date: May 11, 2018

(65) Prior Publication Data
US 2018/0315869 A1 Nov. 1, 2018

(51) Int. Cl.
H01L 31/0224 (2006.01)
H01L 31/18 (2006.01)
(Continued)

(52) U.S. Cl.
CPC .......... *H01L 31/022458* (2013.01); *H01L 21/02348* (2013.01); *H01L 21/31058* (2013.01);
(Continued)

(58) Field of Classification Search
CPC ..... H01L 31/022441; H01L 31/022458; H01L 31/022425; H01L 31/022411; H01L 31/18;
(Continued)

(56) References Cited

U.S. PATENT DOCUMENTS 9,281,435 B2 * 3/2016 Zhang ............... H01L 31/02245
2011/0005582 A1 * 1/2011 Szlufcik ............ H01L 31/02245
136/252

(Continued)

FOREIGN PATENT DOCUMENTS

JP 2009-253096 A 10/2009
JP 2012-69594 A 4/2012
(Continued)

OTHER PUBLICATIONS

Dec. 13, 2016 International Search Report issued in International Patent Application No. PCT/JP2016/004822.
(Continued)

*Primary Examiner* — Michael M Trinh
(74) *Attorney, Agent, or Firm* — Oliff PLC

(57) ABSTRACT

A method for producing a solar cell having good photoelectric conversion characteristics with high productivity, including the steps of: forming a first electrode on a first main surface of a semiconductor substrate; applying an insulator film precursor to cover at least part of the first electrode; temporarily curing the insulator film precursor; applying a conductive paste to at least the insulator film precursor; curing the conductive paste to form a second electrode; and completely curing the insulator film precursor to form an insulator film, the method in which the step of applying the conductive paste so as to be electrically insulated from the first electrode is performed after the step of temporarily curing the insulator film precursor and at least (Continued)

part of the steps of curing the conductive paste to form the second electrode and completely curing the insulator film precursor to form the insulator film are concurrently performed.

16 Claims, 2 Drawing Sheets

(51) Int. Cl.
    *H01L 31/028*     (2006.01)
    *H01L 31/068*     (2012.01)
    *H01L 31/0216*     (2014.01)
    *H01L 21/3105*     (2006.01)
    *H01L 21/02*     (2006.01)
    *H01L 21/321*     (2006.01)

(52) U.S. Cl.
    CPC .......... *H01L 21/321* (2013.01); *H01L 31/028* (2013.01); *H01L 31/02167* (2013.01); *H01L 31/022441* (2013.01); *H01L 31/068* (2013.01); *H01L 31/18* (2013.01); *H01L 31/1868* (2013.01)

(58) Field of Classification Search
    CPC ............. H01L 31/1868; H01L 31/1864; H01L 31/186; H01L 21/02348; H01L 21/283; H01L 21/321; H01L 21/31058; H01L 31/02167; H01L 31/028; H01L 31/068; H01L 31/02245

See application file for complete search history.

(56) References Cited

U.S. PATENT DOCUMENTS

| 2011/0030759 | A1* | 2/2011 | Funakoshi | H01L 31/022441 136/244 |
|---|---|---|---|---|
| 2012/0174960 | A1* | 7/2012 | Hashigami | H01L 31/02167 136/244 |
| 2013/0233381 | A1* | 9/2013 | Win | C08G 73/1042 136/256 |
| 2013/0340821 | A1* | 12/2013 | Akimoto | C03C 8/10 136/256 |
| 2016/0338193 | A1* | 11/2016 | Kanai | H05K 3/4069 |

FOREIGN PATENT DOCUMENTS

| JP | 2014-120554 A | 6/2014 |
|---|---|---|
| WO | 2013/125430 A1 | 8/2016 |

OTHER PUBLICATIONS

Nov. 22, 2017 Search Report issued in Taiwanese Application No. 106107412.

* cited by examiner

METHOD FOR PRODUCING HIGH-EFFICIENCY SOLAR CELL

TECHNICAL FIELD

The present invention relates to a method for producing a high-efficiency solar cell.

BACKGROUND ART

In recent years, a so-called back contact solar cell, in which no electrodes are provided on a light-receiving surface to eliminate optical loss caused by the shadow of electrodes, has been widely studied as a technique of improving the photoelectric conversion efficiency of a crystal silicon solar cell.

FIG. 1 is a schematic diagram depicting an example of the back surface of the back contact solar cell, and FIG. 2 depicts a cross section taken along an alternate long and short dashed line A in FIG. 1. As depicted in FIG. 1, in a solar cell 100, emitter regions (an emitter layer) 112 are formed on the back surface (a first main surface) of a semiconductor substrate (for example, a crystal silicon substrate) 110. Moreover, base regions (a base layer) 113 are formed into the shape of stripes with the emitter regions 112 placed therebetween. Emitter electrodes 122 are formed on the emitter regions 112, and a plurality of the emitter electrodes 122 are coupled by emitter bus bars (bus bar electrode for emitters) 132. Base electrodes 123 are formed on the base regions 113, and a plurality of the base electrodes 123 are coupled by base bus bars (bus bar electrode for bases) 133. On the other hand, the base electrodes 123 are electrically insulated from the emitter regions 112 while the emitter electrodes 122 are electrically insulated from the base regions 113 by insulator films 118. In addition, as depicted in FIG. 2, the solar cell 100 includes passivation films 119 on the first main surface and a second main surface of the semiconductor substrate 110. The passivation films 119 are omitted in FIG. 1.

The structure has been generally formed as follows: after the emitter electrodes 122 and the base electrodes 123 are formed, a resin coating agent is applied to predetermined areas on the substrate by screen printing, inkjet printing, or dispenser application and is completely cured by heat treatment or UV irradiation; and a resin curable conductive paste mainly composed of an electric conductor such as silver, copper, or aluminum is then applied to predetermined areas on the substrate by screen printing, inkjet printing, or dispenser application and is cured by heat treatment.

Patent Document 1 describes a method for forming an electrode by using a polyimide composition for an insulator film, curing the insulator film by heating at 140° C. for 10 minutes and heating at 250° C. for about 30 minutes, then printing silver paste thereon, and performing sintering at 400° C. or higher for 30 seconds.

CITATION LIST

Patent Literature

Patent Document 1: Japanese Unexamined Patent Application Publication No. 2012-69594

SUMMARY OF INVENTION

Technical Problem

However, when the thermosetting electrode is stacked on the sufficiently cured insulator film and subjected to heat treatment as in Patent Document 1, the heat treatment takes a long time, which results in not only a significant reduction of productivity, but also a reduction of toughness due to an excessive amount of heat applied to the insulator film, or insufficient insulation performance due to the contraction of the insulator film.

The present invention has been made in view of the above problems, and an object thereof is to provide a method for producing a solar cell having good photoelectric conversion characteristics with high productivity.

Solution to Problem

To attain the object, the present invention provides a method for producing a solar cell, comprising the steps of:
  forming a first electrode on a first main surface of a semiconductor substrate;
  applying an insulator film precursor so as to cover at least part of the first electrode;
  temporarily curing the insulator film precursor;
  applying a conductive paste to at least the insulator film precursor so as to be electrically insulated from the first electrode;
  curing the conductive paste to form a second electrode; and
  completely curing the insulator film precursor to form an insulator film, wherein
  the step of applying the conductive paste so as to be electrically insulated from the first electrode is performed after the step of temporarily curing the insulator film precursor, and
  at least part of the step of curing the conductive paste to form the second electrode and at least part of the step of completely curing the insulator film precursor to form the insulator film are concurrently performed.

Such a method enables a solar cell having good photoelectric conversion characteristics to be produced with high productivity.

Moreover, the whole of the step of curing the conductive paste to form the second electrode is preferably performed concurrently with the whole of the step of completely curing the insulator film precursor to form the insulator film.

Such a method enables more appropriate amount of heat to be applied to the insulator film precursor at the time of completely curing the insulator film precursor.

Moreover, the insulator film preferably contains one or more resins selected from the group consisting of a silicone resin, a polyamide resin, a polyimide resin, a polyamide-imide resin, a fluorinated resin, a phenolic resin, a melamine resin, a urea resin, a polyurethane, an epoxy resin, an acrylic resin, a polyester resin, and a poval resin.

Since these resins are chemically stable, have a high usable temperature, and allow easy pattern formation, the insulator film preferably contains these resins in the method of the present invention.

Moreover, the conductive paste preferably contains one or more resins selected from the group consisting of an epoxy resin, an acrylic resin, a polyester resin, a phenolic resin, and a silicone resin.

Since these resins are chemically stable, have a high usable temperature, and allow easy pattern formation, the conductive paste preferably contains these resins in the method of the present invention.

Moreover, the semiconductor substrate is preferably a crystal silicon substrate.

The present invention is particularly suitable for production of a solar cell provided with a crystal silicon substrate.

Advantageous Effects of Invention

The method of the present invention makes it possible to provide a solar cell having high photoelectric conversion efficiency by a simple process. In particular, concurrently performing curing of a conductive paste and main curing of an insulator film precursor can shorten the total time required for curing these materials. Moreover, this concurrent curing enables more appropriate amount of heat to be applied to the insulator film precursor, as compared to a conventional method in which a second electrode is formed after an insulator film is sufficiently cured, thus maintaining the toughness of a resulting insulator film. As described above, the method of the present invention makes it less likely that an excessive amount of heat is applied to the insulator film precursor as compared to the conventional method, and thus can prevent the contraction of the insulator film and insufficient insulation performance.

DESCRIPTION OF EMBODIMENTS

Hereinafter, the present invention will be explained in more detail.

As mentioned earlier, there is a need for a method for producing a solar cell having good photoelectric conversion characteristics with high productivity.

The present inventors have conducted an intensive study to attain the object. As a result, they find out that the object can be accomplished by a method for producing a solar cell, comprising the steps of:

forming a first electrode on a first main surface of a semiconductor substrate;
applying an insulator film precursor so as to cover at least part of the first electrode;
temporarily curing the insulator film precursor;
applying a conductive paste to at least the insulator film precursor so as to be electrically insulated from the first electrode;
curing the conductive paste to form a second electrode; and
completely curing the insulator film precursor to form an insulator film, wherein
the step of applying the conductive paste so as to be electrically insulated from the first electrode is performed after the step of temporarily curing the insulator film precursor, and
at least part of the step of curing the conductive paste to form the second electrode and at least part of the step of completely curing the insulator film precursor to form the insulator film are concurrently performed, thereby bringing the present invention to completion.

Hereinafter, embodiments of the present invention will be specifically explained with reference to the drawings, but the present invention is not limited to these embodiments.

Figure 1:
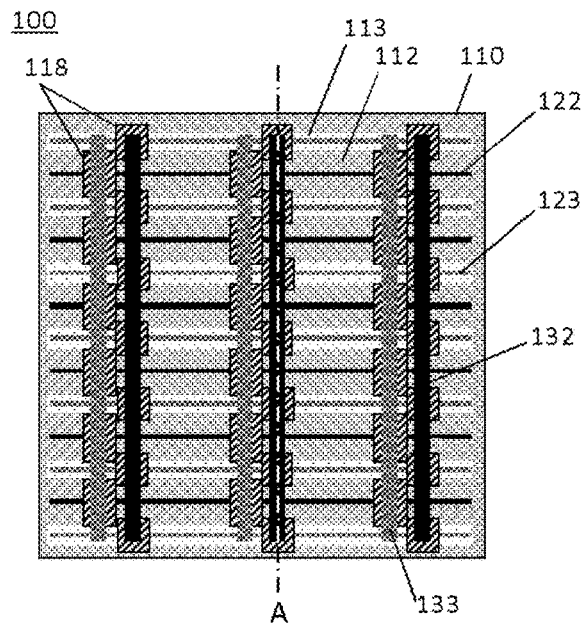
FIG. 1 is a diagram depicting a back surface structure of a back contact solar cell.
Figure 2:
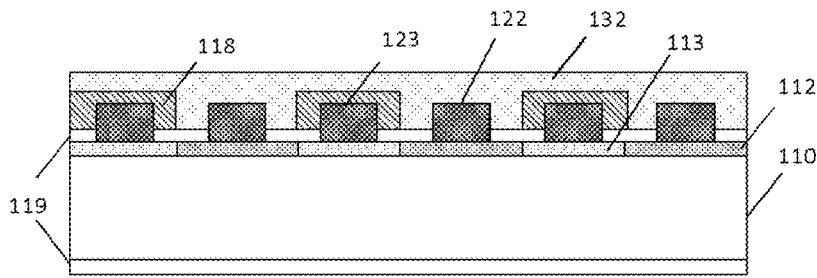
FIG. 2 is a diagram depicting a cross-sectional structure of the back contact solar cell.

The method for producing a solar cell of the present invention can be applied to a solar cell depicted in FIGS. 1 and 2. Hereinafter, the solar cell production method of the present invention will be specifically explained with reference to FIGS. 1 and 2 in conjunction with a case using an N-type substrate.

First, an N-type semiconductor substrate such as an N-type crystal silicon substrate is prepared. Specifically, an as-cut single crystal {100} N-type silicon substrate in which high-purity silicon is doped with a quinquevalent element such as phosphorus, arsenic, or antimony so as to give a specific resistance of 0.1 to 5 Ω·cm may be prepared.

Next, minute projections and depressions called texture may be formed on a light-receiving surface of the semiconductor substrate to reduce the reflectivity of a solar cell.

Next, as depicted in FIGS. 1 and 2, emitter regions 112 having a conductivity type opposite to that of the semiconductor substrate 110 and base regions 113 having the same conductivity type as that of the semiconductor substrate 110 are formed on the back surface (a first main surface) of the semiconductor substrate 110. A method for forming the emitter regions 112 and the base regions 113 is not limited to a particular method, and any known method can be used. For example, the emitter regions 112 can be formed by vapor phase diffusion using $BBr_3$ or the like. The base regions 113 can be formed by vapor phase diffusion using phosphorus oxychloride. Furthermore, when the emitter regions 112 and the base regions 113 are formed, a diffusion mask composed of a silicon oxide film, a silicon nitride film, or the like may be used to form the emitter regions 112 and the base regions 113 with desired shapes. For example, as depicted in FIG. 1, stripe-shaped base regions 113 may be formed, while emitter regions 112 are formed except for areas where the base regions 113 are formed.

Next, passivation films 119 composed of a silicon nitride film, a silicon oxide film, or the like are formed on the light-receiving surface and the back surface of the semiconductor substrate 110. The silicon nitride film can be formed by CVD. The silicon oxide film can be formed by CVD or thermal oxidation.

Next, a first electrode is formed on the first main surface of the semiconductor substrate. In the case of the solar cell with the back surface structure as depicted in FIG. 1, emitter electrodes 122 and base electrodes 123 which extend in a horizontal direction are formed as the first electrode on the emitter regions 112 and the base regions 113.

A method for forming the first electrode is not limited to a particular method; however, from the viewpoint of productivity, it is preferable to form the first electrode by screen printing or dispenser formation using a conductive paste. In this case, the emitter electrodes 122 and the base electrodes 123 are formed as follows: an Ag paste obtained by mixing Ag powder and glass frit with an organic binder is applied to the emitter regions 112 and the base regions 113 with the passivation film 119 being inserted; the Ag paste is then dried; and the Ag paste is sintered at about 700 to 880° C. for 1 to 30 minutes. As a result of this heat treatment, the passivation film 119 is eroded by the Ag paste, whereby the electrodes make electrical contact with the silicon.

Alternatively, plating may be applied. In this case, since the substrate front surface is necessarily exposed in portions where the electrodes are to be formed, the passivation film 119 in these portions is removed by laser ablation, for example.

Next, an insulator film precursor is applied so as to cover at least part of the first electrode. When the solar cell with the back surface structure depicted in FIG. 1 is produced, the insulator film precursor is applied to portions where the emitter regions 112 intersect with base bus bars 133 and portions where the base regions 113 intersect with emitter bus bars 132. In this case, of the emitter electrodes 122 which are linearly formed as the first electrode, only regions intersecting the base bus bars 133 are covered with the insulator film precursor. Furthermore, of the base electrodes 123 which are linearly formed as the first electrode, only regions intersecting the emitter bus bars 132 are covered with the insulator film precursor. The insulator film precursor will become an insulator film by undergoing temporary curing and complete curing, which will be described later.

As the insulator film, which is required to have characteristics such as being chemically stable and having a high usable temperature and allowing easy pattern formation, resins mainly composed of a silicone resin, a polyamide resin, a polyimide resin, a polyamide-imide resin, a fluorinated resin, a phenolic resin, a melamine resin, a urea resin, a polyurethane, an epoxy resin, an acrylic resin, a polyester resin, or a poval resin can be used. One of these resins may be used alone or two or more of these resins may be used in combination.

A method for forming the insulator film precursor is not limited to a particular method; however, from the viewpoint of productivity, it is preferable to form the insulator film precursor by screen printing or dispenser formation using a precursor obtained by mixing the resin or a raw material of the resin with a solvent or the like into paste. The solvent may be appropriately selected depending on the resin contained in the insulator film. For example, when an insulator film containing a polyimide resin is formed, N-methyl-2-pyrrolidone or the like can be used.

Next, the insulator film precursor is temporarily cured. Specifically, after the paste of the insulator film precursor is printed, low-temperature heat treatment is performed in an atmosphere to temporarily cure the insulator film precursor. Herein, "temporarily curing" is to dry the insulator film precursor by evaporating the solvent contained therein and, at the same time, perform curing to such an extent that the insulator film precursor will not be subjected to plastic deformation in subsequent steps.

The heat treatment conditions in this step should be optimized depending on the used insulator film precursor; in general, heat treatment at about 80 to 200° C., preferably about 120 to 200° C., for about 1 to 10 minutes is often enough. If the amount of heat is insufficient, that is, if temporary curing is not achieved at this point in time, the insulator film precursor is deformed and locally thinned when an electrode is stacked in a subsequent step, which easily causes a short circuit. By contrast, if the insulator film precursor is completely cured at this point in time by applying a larger amount of heat, an excessive amount of heat is applied to the insulator film precursor, and the insulator film precursor consequently contracts and is locally thinned when an electrode is cured in a subsequent step, which easily causes a short circuit.

After the insulator film precursor is temporarily cured, a conductive paste is applied to at least the insulator film precursor so as to be electrically insulated from the first electrode. The conductive paste is used for forming a second electrode. That is, the present invention allows the first electrode and the second electrode to electrically insulate from each other by the insulator film. Here, if the first electrode is the emitter electrode 122, the second electrode may be the base bus bar 133. If the first electrode is the base electrode 123, the second electrode may be the emitter bus bar 132. That is, as depicted in FIG. 1, it is possible to electrically insulate only the first electrode and the second electrode having different conductivity types from each other by the insulator film while bring the first electrode and the second electrode having the same conductivity type into electrical conduction.

Since the second electrode (the emitter bus bars 132 and the base bus bars 133) is required to have characteristics such as being chemically stable and having a high usable temperature and allowing easy pattern formation, it is preferable to mix powder of silver, copper, or aluminum with an epoxy resin, an acrylic resin, a polyester resin, a phenolic resin, or a silicone resin to obtain paste and form the second electrode by screen printing or dispenser formation using this paste. One of these resins may be used alone or two or more of these resins may be used in combination.

In this case, in order to dry the coating film by evaporating the solvent after the paste is printed, low-temperature heat treatment is preferably performed in an atmosphere. This drying process is important in preventing leveling of the coating film. The heat treatment conditions have to be optimized depending on the used insulator film precursor; in general, heat treatment is performed at about 80 to 200° C. for about 1 to 3 minutes to evaporate the solvent and dry the film. This heat treatment may be performed with a hot plate for single wafer processing, or with a belt furnace or a walking beam furnace.

Then, the conductive paste is cured to form the second electrode. Moreover, the insulator film precursor is completely cured to form the insulator film. In the present invention, at least part of the step of curing the conductive paste to form the second electrode and at least part of the step of completely curing the insulator film precursor to form the insulator film are concurrently performed. Specifically, the substrate is subjected to heat treatment in an atmosphere at 200° C. to 400° C. for about 10 seconds to 5 minutes, whereby completely curing of the insulator film precursor and curing of the conductive paste for forming the bus bars are concurrently performed. When the temperature is 200° C. or higher, sufficient curing and adhesion strength can be achieved; when the temperature is 400° C. or lower, it is possible to make the amount of heat applied to the resin more appropriate, and thus the toughness of the resulting insulator film can be maintained. In this heat treatment, an in-line apparatus such as a belt furnace or a walking beam furnace is suitably used.

Here, if a temperature required for curing the second electrode is higher than a temperature for completely curing the insulator film precursor, the insulator film precursor starts completely curing before the temperature reaches the temperature for curing the second electrode. In this case, part of the step of curing the conductive paste to form the second electrode and part of the step of completely curing the insulator film precursor to form the insulator film are concurrently performed. By contrast, if the temperature for curing the second electrode are the same as the temperature for completely curing the insulator film precursor, the whole of the step of curing the conductive paste to form the second electrode and the whole of the step of completely curing the insulator film precursor to form the insulator film can be concurrently performed. The latter case enables more appropriate amount of heat to be applied to the insulator film precursor at the time of completely curing the insulator film precursor.

Although the above description is in conjunction with the case where the substrate is an N-type substrate, the method of the present invention can also be applied to a case where the substrate is a P-type substrate. That is, an N-type layer may be provided as an emitter layer while a P-type layer may be provided as a base layer.

Figure 3:
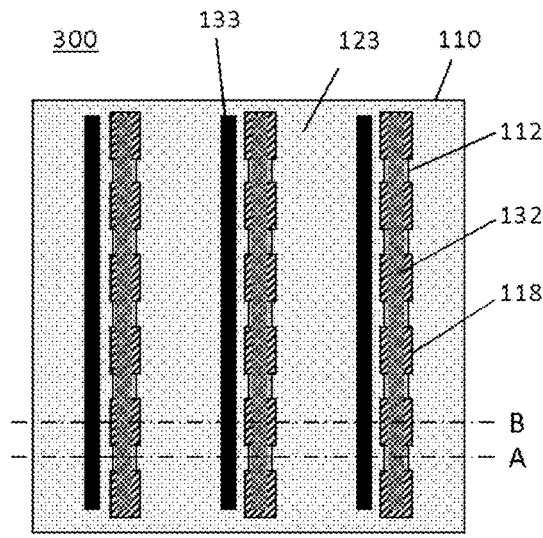
FIG. 3 is a diagram depicting a back surface structure of a back contact solar cell according to another embodiment of the present invention.
Figure 4:
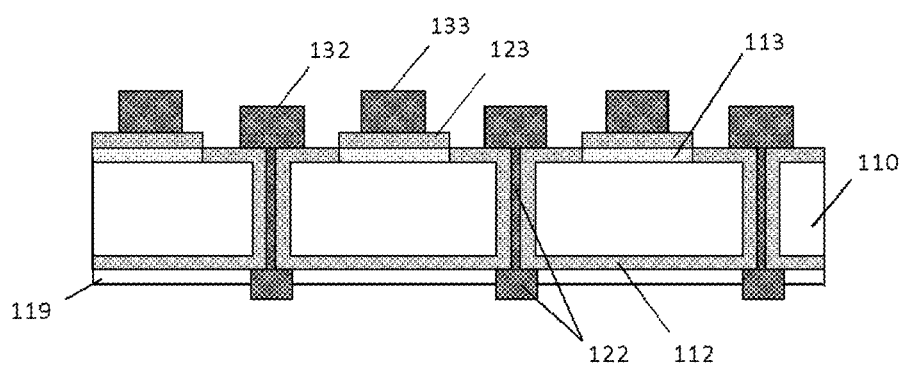
FIG. 4 is a diagram depicting a cross-sectional structure of the back contact solar cell according to the other embodiment of the present invention.
Figure 5:
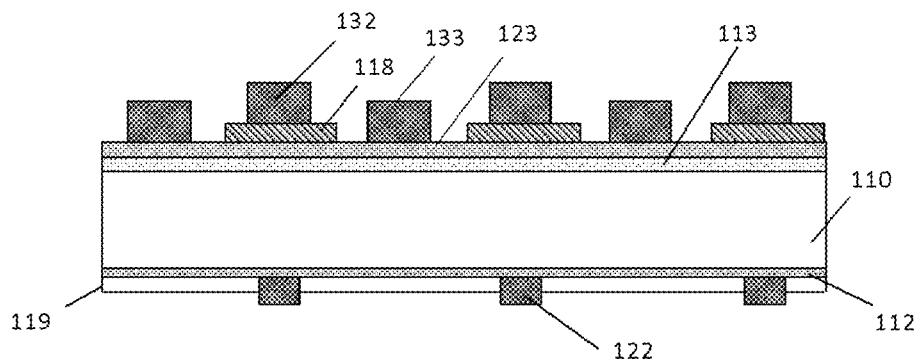
FIG. 5 is a diagram depicting a cross-sectional structure observed in a different position of the back contact solar cell according to the other embodiment of the present invention.

The method of the present invention can also be applied to a solar cell depicted in FIGS. 3 to 5. FIG. 3 is a diagram depicting the back surface of an emitter wrap through solar cell 300 as a solar cell according to another embodiment of the present invention, and FIGS. 4 and 5 depict the cross sections taken along alternate long and short dashed lines A and B in FIG. 3. In FIGS. 4 and 5, the light-receiving surface faces downward.

In this embodiment, most of the back surface of a substrate 110 is occupied by a base region 113 and a base electrode 123 formed on the base region 113, and emitter regions 112 are formed in the shape of islands in regions between insulator films 118. On the other hand, a light-receiving surface is occupied by an emitter region 112 that connects with the emitter regions 112 on the back surface through via holes formed in the substrate 110. Moreover, emitter electrodes 122 are connected between the light-receiving surface and the back surface through the via holes. On the light-receiving surface, a passivation film 119 is formed. Furthermore, base bus bars 133 are linearly formed on the base electrode 123 on the back surface of the substrate 110. In addition, emitter bus bars 132 are linearly formed on the emitter regions 112 and the emitter electrodes 122 on the back surface of the substrate 110. However, as depicted in FIG. 5, in regions where the emitter bus bars 132, which are each a second electrode, intersect with the base electrode 123, which is a first electrode, the base electrode 123 is covered with the insulator films 118.

EXAMPLE

Hereinafter, the present invention will be explained more specifically with reference to Examples and Comparative Examples, but the present invention is not limited to the following examples.

Example 1

A solar cell depicted in FIGS. 1 and 2 was produced by the method of the present invention.

Using a phosphorus-doped <100> n-type as-cut silicon substrate 150 mm square having a thickness of 200 μm and a specific resistance of 1 Ω·cm, emitter regions and base regions were formed on the back surface of the substrate.

This substrate was subjected to heat treatment in an oxygen atmosphere at 900° C. for 10 minutes, whereby a silicon oxide film was formed on both surfaces of the substrate. Then, a silicon nitride film having a thickness of 90 nm was formed on both surfaces of the substrate by plasma CVD.

Then, Ag paste was applied to the emitter regions and base regions by screen printing, and the Ag paste was cured by performing heat treatment at 800° C. for 3 seconds, whereby emitter electrodes and base electrodes were formed.

Next, a polyimide paste (HP-1000 manufactured by Hitachi Chemical Co., Ltd.) was applied to predetermined areas by screen printing and subjected to heat treatment on a hot plate at 120° C. for 3 minutes, whereby the polyimide paste was temporarily cured.

Then, a thermosetting Ag paste (CA-8590B manufactured by Daiken Chemical Co., Ltd.) was applied to the back surface of the substrate by screen printing, dried on a hot plate at 170° C. for 1 minute, and subjected to heat treatment at 300° C. for 5 minutes. Incidentally, when the thermosetting Ag paste was applied, the thermosetting Ag paste for an emitter bus bar was applied so as to be electrically insulated from the base electrodes while the thermosetting Ag paste for a base bus bar was applied so as to be electrically insulated from the emitter electrodes (see FIG. 1). By the heat treatment, the polyimide paste and the thermosetting Ag paste were concurrently cured. That is, at least part of a step of curing the thermosetting Ag paste to form the emitter bus bar and the base bus bar were concurrently performed with at least part of a step of completely curing the polyimide paste to form an insulator film. In this way, a solar cell was obtained.

The output characteristics of the produced solar cell were measured by using a pseudo sunlight of xenon lamp light source-type.

Example 2

Using the substrate as in Example 1, emitter electrodes and base electrodes were formed according to the same solar cell production method.

Next, an epoxy paste (SFX513M1LC manufactured by Shin-Etsu Chemical Co., Ltd.) was applied to predetermined areas by screen printing and subjected to heat treatment on a hot plate at 170° C. for 1 minute, whereby the epoxy paste was temporarily cured.

The subsequent steps were performed in the same manner as in Example 1, whereby a solar cell was obtained.

The output characteristics of the produced solar cell were measured by using a pseudo sunlight of xenon lamp light source-type.

Comparative Example 1

Using the substrate as in Example 1, emitter electrodes and base electrodes were formed according to the same solar cell production method.

Next, a polyimide paste (HP-1000 manufactured by Hitachi Chemical Co., Ltd.) was applied to predetermined areas by screen printing and subjected to heat treatment on a hot plate at 100° C. for 3 minutes to be dried. At this time, the polyimide paste was not temporarily cured.

The subsequent steps were performed in the same manner as in Example 1, whereby a solar cell was obtained.

The output characteristics of the produced solar cell were measured by using a pseudo sunlight of xenon lamp light source-type.

Comparative Example 2

Using the substrate as in Example 1, emitter electrodes and base electrodes were formed according to the same solar cell production method.

Next, a polyimide paste (HP-1000 manufactured by Hitachi Chemical Co., Ltd.) was applied to predetermined areas by screen printing, subjected to heat treatment on a hot plate at 100° C. for 3 minutes to be dried, and subjected to heat treatment on a hot plate at 200° C. for 1 hour, whereby the polyimide paste was cured. That is, before applying a thermosetting Ag paste for forming an emitter bus bar and a base bus bar, the polyimide paste was completely cured.

The subsequent steps were performed in the same manner as in Example 1, whereby a solar cell was obtained.

The output characteristics of the produced solar cell were measured by using a pseudo sunlight of xenon lamp light source-type.

Table 1 shows solar cell characteristics of Examples 1 and 2 and Comparative Examples 1 and 2.

TABLE 1

|  | Short-circuit current density [mA/cm$^2$] | Open-circuit voltage [mV] | Fill factor | Conversion efficiency [%] |
| --- | --- | --- | --- | --- |
| Example 1 | 40.9 | 0.679 | 0.796 | 22.1 |
| Example 2 | 40.7 | 0.678 | 0.799 | 22.0 |
| Comparative Example 1 | 39.5 | 0.673 | 0.775 | 20.6 |
| Comparative Example 2 | 39.7 | 0.675 | 0.785 | 21.0 |

As shown in Table 1, Examples 1 and 2 exhibited better solar cell characteristics than Comparative Example (an example in which the step of applying the conductive paste so as to be electrically insulated from the first electrode was not performed after the step of temporarily curing the insulator film precursor) and Comparative Example 2 (an example in which at least part of the step of curing the conductive paste to form the second electrode and at least part of the step of completely curing the insulator film precursor to form an insulator film were not concurrently performed). This indicates that the present invention can provide a high-efficiency solar cell by a simple process.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. A method for producing a solar cell, comprising the steps of:
    forming a first electrode on a first main surface of a semiconductor substrate;
    applying an insulator film precursor so as to cover at least part of the first electrode;
    temporarily curing the insulator film precursor;
    applying a conductive paste to at least the insulator film precursor so as to be electrically insulated from the first electrode;
    curing the conductive paste to form a second electrode; and
    completely curing the insulator film precursor to form an insulator film, wherein
    the step of applying the conductive paste so as to be electrically insulated from the first electrode is performed after the step of temporarily curing the insulator film precursor, and
    at least part of the step of curing the conductive paste to form the second electrode and at least part of the step of completely curing the insulator film precursor to form the insulator film are concurrently performed.

2. The method for producing a solar cell according to claim 1, wherein
    a whole of the step of curing the conductive paste to form the second electrode is performed concurrently with a whole of the step of completely curing the insulator film precursor to form the insulator film.

3. The method for producing a solar cell according to claim 1, wherein
    the insulator film contains one or more resins selected from the group consisting of a silicone resin, a polyamide resin, a polyimide resin, a polyamide-imide resin, a fluorinated resin, a phenolic resin, a melamine resin, a urea resin, a polyurethane, an epoxy resin, an acrylic resin, a polyester resin, and a poval resin.

4. The method for producing a solar cell according to claim 2, wherein
    the insulator film contains one or more resins selected from the group consisting of a silicone resin, a polyamide resin, a polyimide resin, a polyamide-imide resin, a fluorinated resin, a phenolic resin, a melamine resin, a urea resin, a polyurethane, an epoxy resin, an acrylic resin, a polyester resin, and a poval resin.

5. The method for producing a solar cell according to claim 1, wherein
    the conductive paste contains one or more resins selected from the group consisting of an epoxy resin, an acrylic resin, a polyester resin, a phenolic resin, and a silicone resin.

6. The method for producing a solar cell according to claim 2, wherein
    the conductive paste contains one or more resins selected from the group consisting of an epoxy resin, an acrylic resin, a polyester resin, a phenolic resin, and a silicone resin.

7. The method for producing a solar cell according to claim 3, wherein
    the conductive paste contains one or more resins selected from the group consisting of an epoxy resin, an acrylic resin, a polyester resin, a phenolic resin, and a silicone resin.

8. The method for producing a solar cell according to claim 4, wherein
    the conductive paste contains one or more resins selected from the group consisting of an epoxy resin, an acrylic resin, a polyester resin, a phenolic resin, and a silicone resin.

9. The method for producing a solar cell according to claim 1, wherein
    the semiconductor substrate is a crystal silicon substrate.

10. The method for producing a solar cell according to claim 2, wherein
    the semiconductor substrate is a crystal silicon substrate.

11. The method for producing a solar cell according to claim 3, wherein
    the semiconductor substrate is a crystal silicon substrate.

12. The method for producing a solar cell according to claim 4, wherein
    the semiconductor substrate is a crystal silicon substrate.

13. The method for producing a solar cell according to claim 5, wherein
    the semiconductor substrate is a crystal silicon substrate.

14. The method for producing a solar cell according to claim 6, wherein
    the semiconductor substrate is a crystal silicon substrate.

15. The method for producing a solar cell according to claim 7, wherein
    the semiconductor substrate is a crystal silicon substrate.

16. The method for producing a solar cell according to claim 8, wherein
    the semiconductor substrate is a crystal silicon substrate.

* * * * *